United States Patent
Ryu et al.

(10) Patent No.: US 9,349,988 B2
(45) Date of Patent: May 24, 2016

(54) ORGANIC LIGHT EMITTING DISPLAY DEVICE

(71) Applicant: SAMSUNG DISPLAY CO., LTD., Yongin-si, Gyeonggi-do (KR)

(72) Inventors: Ji-Hun Ryu, Suwon-si (KR); SeongMin Wang, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 0 days.

(21) Appl. No.: 14/624,515

(22) Filed: Feb. 17, 2015

(65) Prior Publication Data
US 2015/0162565 A1 Jun. 11, 2015

Related U.S. Application Data

(63) Continuation-in-part of application No. 14/015,828, filed on Aug. 30, 2013, now Pat. No. 9,000,427.

(30) Foreign Application Priority Data

Nov. 20, 2012 (KR) .......................... 10-2012-0131458

(51) Int. Cl.
*H01L 51/00* (2006.01)
*H01L 51/52* (2006.01)

(52) U.S. Cl.
CPC ................................ *H01L 51/5256* (2013.01)

(58) Field of Classification Search
CPC .. H01L 51/5237; H01L 51/5256; H01L 51/56
USPC ................................................. 257/40, 59, 72
See application file for complete search history.

(56) References Cited

U.S. PATENT DOCUMENTS

| | | |
|---|---|---|
| 2003/0209708 A1* | 11/2003 | Kubota ............... H01L 51/5237 257/40 |
| 2006/0040135 A1 | 2/2006 | Morii |
| 2008/0309226 A1 | 12/2008 | Kim et al. |
| 2009/0021157 A1 | 1/2009 | Kim et al. |
| 2009/0267487 A1 | 10/2009 | Kwack et al. |
| 2010/0181903 A1 | 7/2010 | Kim et al. |
| 2011/0163330 A1 | 7/2011 | Kim et al. |
| 2012/0091477 A1 | 4/2012 | Kim |
| 2012/0133275 A1 | 5/2012 | Lee et al. |
| 2012/0168796 A1 | 7/2012 | Moon et al. |
| 2012/0248422 A1 | 10/2012 | Mine et al. |

FOREIGN PATENT DOCUMENTS

| | | |
|---|---|---|
| KR | 10-2009-0112387 A | 10/2009 |
| KR | 10-2010-0085347 | 7/2010 |

(Continued)

OTHER PUBLICATIONS

KIPO Office action dated Dec. 16, 2013, for corresponding Korean Patent application 10-2012-0131458, (6 pages).

*Primary Examiner* — Tu-Tu Ho
(74) *Attorney, Agent, or Firm* — Lewis Roca Rothgerber Christie LLP

(57) ABSTRACT

An organic light emitting display device, and more particularly, to an organic light emitting display device that reduces (or prevents) penetration of moisture into ends of inorganic layers and a lifting phenomenon between inorganic layers, by increasing areas of a plurality of inorganic layers included in a thin film encapsulation layer in sequence.

7 Claims, 3 Drawing Sheets

(56) References Cited

FOREIGN PATENT DOCUMENTS

| KR | 10-2011-0048683 A | 5/2011 |
| KR | 10-2012-0040480 A | 4/2012 |
| KR | 10-2012-0057286 A | 6/2012 |
| KR | 10-2012-0112056 A | 10/2012 |

* cited by examiner

ORGANIC LIGHT EMITTING DISPLAY DEVICE

CROSS-REFERENCE TO RELATED APPLICATIONS

This application is a continuation in part of U.S. patent application Ser. No. 14/015,828, filed Aug. 30, 2013, which claims priority to and the benefit of Korean Patent Application No. 10-2012-0131458, filed on Nov. 20, 2012, with the Korean Intellectual Property Office, the present invention of which is incorporated herein in its entirety by reference.

TECHNICAL FIELD

Embodiments of the present invention relate to an organic light emitting display device, and more particularly, to an organic light emitting display device that reduces (or prevents) penetration of moisture into ends of inorganic layers and a lifting phenomenon between inorganic layers, by increasing areas of a plurality of inorganic layers included in a thin film encapsulation layer in sequence.

BACKGROUND

An organic light emitting display device is a self-emission display device which has an organic light emitting diode that emits light to display an image. Since an organic light emitting display device generally does not require a separate light source unlike a liquid crystal display, it is possible to relatively reduce a thickness and weight thereof. In addition, an organic light emitting display device may exhibit characteristics such as low power consumption, high luminance, and a rapid response speed.

In an organic light emitting display device, a display unit may deteriorate due to penetration of oxygen or moisture. Accordingly, in order to reduce (or prevent) oxygen or moisture from penetrating from the outside, an encapsulation structure for sealing and protecting the display unit may be used.

For example, an encapsulation structure including a thin film encapsulation structure which covers the display unit by a multilayer, in which organic layers and inorganic layers are alternately laminated, has been adopted. That is, the display unit is sealed by alternately laminating the organic layers and the inorganic layers on the display unit of the substrate. Here, the organic layers may function to give flexibility to a flat panel display, and the inorganic layers may function to reduce (or prevent) penetration of oxygen or moisture.

SUMMARY

Aspects of embodiments of the present invention provide an organic light emitting display device for improving an encapsulation structure to more efficiently protect an organic light emitting diode unit. For example, some embodiments of the present invention provide an organic light emitting display device for reducing (or preventing) a lifting phenomenon of edges of inorganic layers and more efficiently blocking moisture and oxygen from penetrating.

An exemplary embodiment of the present invention provides An organic light emitting display device comprise: a substrate; a display area on the substrate; and an encapsulation layer disposed on the display area and comprising a plurality of norganic layers and a plurality of organic layers, wherein the plurality of inorganic layers and the plurality of organic layers are alternately laminated, the inorganic layer comprises at least first to third inorganic layers, the organic layer comprises at least first and second organic layers, the first inorganic layer is disposed on the display area, the first organic layer is disposed on the first inorganic layer, the second inorganic layer is disposed on the first organic layer and covers end portions of the first inorganic layer, the second organic layer is disposed on the second inorganic layer, and the third inorganic layer is disposed on the second organic layer and the second inorganic layer.

The third inorganic layer may not cover end portions of the second inorganic layer.

An upper inorganic layer may not cover end portions of a lower inorganic layer among the plurality of inorganic layers on the third inorganic layer.

The second inorganic layer may cover the end portions of the first organic layer.

The third inorganic layer may cover the end portions of the second inorganic layer.

The inorganic layer may further comprise a fourth inorganic layer, and the fourth inorganic layer is disposed on the third inorganic layer and covers the end portions of the second inorganic layer and end portions of the third inorganic layer.

The third inorganic layer may not cover the end portions of the second inorganic layer.

The second inorganic layer may cover the end portions of the first organic layer.

The third inorganic layer may cover the end portions of the second organic layer.

In the organic light emitting display device according to an exemplary embodiment of the present invention, it is possible to reduce (or prevent) a lifting phenomenon between inorganic layers which are in contact with each other and reduce (or block) penetration of oxygen or moisture into edges of the inorganic layers.

The foregoing summary is illustrative only and is not intended to be in any way limiting. In addition to the illustrative aspects, embodiments, and features described above, further aspects, embodiments, and features will become apparent by reference to the drawings and the following detailed description.

DETAILED DESCRIPTION

Figure 1:
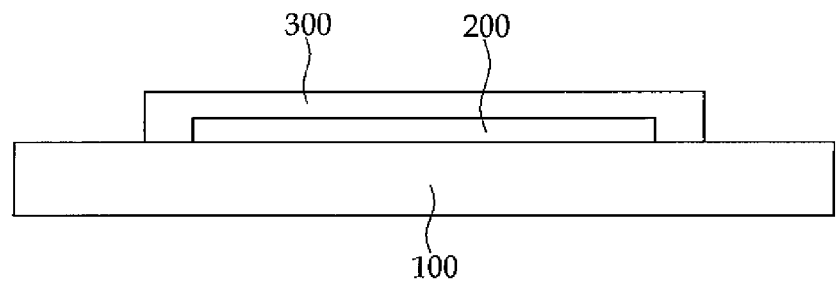
FIG. 1 is a cross-sectional view schematically illustrating an organic light emitting display device according to an exemplary embodiment of the present invention.

Hereinafter, exemplary embodiments of the present invention will be described in more detail with reference to the accompanying drawings. However, the scope of the present invention is not limited to the following examples and drawings. Exemplary embodiments to be described below and illustrated in the drawings may include various equivalences and modifications.

The terminology used in this specification is used in order to express exemplary embodiments of the present invention and may depend on the intention of users or operators or the custom in the art to which the present invention belongs. Accordingly, the terminology should be viewed in the context of the details described throughout this specification.

For reference, respective components and shapes thereof may be schematically drawn or exaggeratedly drawn in the accompanying drawings for ease of understanding. Like reference numerals designate like elements throughout the drawings.

Further, it will be understood that when a layer or an element is described as being "on" another layer or element, it may be directly disposed on another layer or element, or an intervening layer or element may also be present.

FIG. 1 is a cross-sectional view schematically illustrating an organic light emitting display device according to an exemplary embodiment of the present invention. Referring to FIG. 1, the organic light emitting display device according to an exemplary embodiment of the present invention includes a substrate 100, a display unit 200 formed on the substrate 100, and an encapsulation layer 300 formed on the display unit 200.

The substrate 100 may be made of various materials such as a glass substrate, a quartz substrate, and a transparent resin substrate, and may be formed by using a flexible material. The transparent resin substrate which may be used as the substrate 100 may contain a polyimide resin, an acrylic resin, a polyacrylate resin, a polycarbonate resin, a polyether resin, a polyethylene terephthalate resin, a sulfonic acid resin, and the like.

In the case where the organic light emitting diode display is a rear emission type and an image is displayed toward the substrate 100 side, the substrate 100 may be made of a light transmitting material, but in the case of a front emission type where an image is displayed toward the encapsulation layer 300 side, the substrate 100 may not necessarily be made of a light transmitting material.

The display unit 200 is an element including an emission layer 230. A detailed configuration according to an embodiment will be described below.

In one embodiment, the encapsulation layer 300 has a structure in which organic layers 320 and inorganic layers 310 are alternately laminated. In order to reduce (or prevent) oxygen or moisture from penetrating from the outside, the organic layers 320 may be positioned at the inner side of the encapsulation layer 300, adjacent to the display unit, and the inorganic layers 310 may be positioned toward the outer side of encapsulation layer, away from the display unit.

The inorganic layers 310 may be laminated to have substantially the same size, and in this case, a space may be formed between ends of two inorganic layers 310 which are in contact with each other at edges of the inorganic layers 310, and as a result, a lifting phenomenon between the inorganic layers 310 occurs, and oxygen or moisture may penetrate between the ends of the inorganic layers 310.

Figure 2:
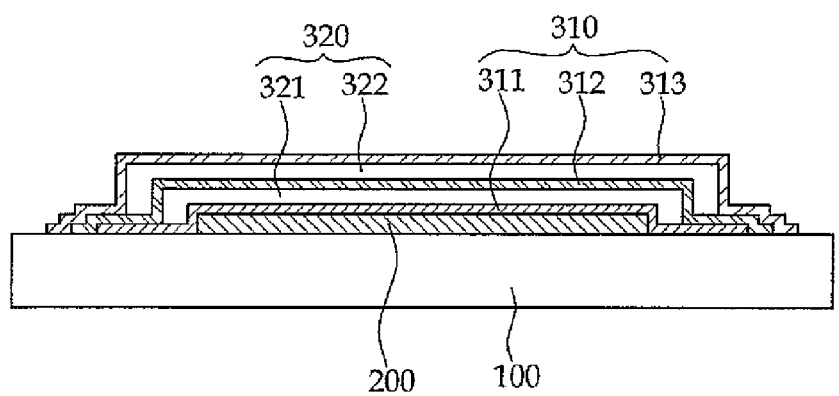
FIG. 2 is a cross-sectional view enlarging an encapsulation layer in the organic light emitting display device of FIG. 1.

FIG. 2 is a cross-sectional view enlarging an encapsulation layer in the organic light emitting display device of FIG. 1.

Referring to FIG. 2, the encapsulation layer 300 may include a plurality of inorganic layers 310 and a plurality of organic layers 320. The plurality of inorganic layers 310 and the plurality of organic layers 320 may be alternately laminated.

The outermost layer of the encapsulation layer 300 is constituted by the inorganic layer 310.

In FIG. 2, the plurality of inorganic layers 310 includes a first inorganic layer 311, a second inorganic layer 312, and a third inorganic layer 313. However, embodiments of the present invention are not limited thereto, and the inorganic layers 310 may be formed with four or more layers.

In FIG. 2, the plurality of organic layers 320 includes a first organic layer 321 and a second organic layer 322. However, embodiments of the present invention are not limited thereto, and the organic layers 320 may be formed with three or more layers.

The plurality of organic layers 320 may be formed in a region where the plurality of inorganic layers 310 is disposed.

For example, the first organic layer 321 may be formed in a region where the first inorganic layer 311 and the second inorganic layer 312 are disposed, and the second organic layer 322 may be formed in a region where the second inorganic layer 312 and the third inorganic layer 313 are disposed. That is, the organic layers 320 may be completely covered by the inorganic layers 310 formed on the organic layers 320.

For example, the first organic layer 321 may be formed on the first inorganic layer 311 and formed in the region of the first inorganic layer 311. The second inorganic layer 312 may be formed on the first organic layer 321, and the second inorganic layer 312 may completely cover the first organic layer 321 up to the first inorganic layer 311. The second organic layer 322 and the third inorganic layer 313 may be continuously formed by the method.

The plurality of inorganic layers 310 may cover the display unit 200 and may be laminated on the substrate 100 in sequence, and areas thereof may be increased moving in a direction away from the display unit 200.

For example, an area of the first inorganic layer 311 may be smaller than an area of the second inorganic layer 312, and an area of the second inorganic layer 312 may be smaller than an area of the third inorganic layer 313. An area of the plurality of inorganic layers 310 may be formed to cover all of the laminated inorganic layers 310 and organic layers 320 (e.g., the lower laminated inorganic layers 310 and organic layers 320).

According to an embodiment, since the areas of the plurality of organic layers 320 are smaller than the areas of the plurality of inorganic layers 310, the edge of the encapsulation layer 300 may have a structure in which the plurality of inorganic layers 310 is sequentially laminated on the substrate 100. That is, the plurality of inorganic layers 310 may have a structure in which the upper inorganic layer covers the end of the lower inorganic layer. The upper inorganic layer may mean that the inorganic layer is relatively far away from the substrate 100 in a vertical direction of the substrate 100, and the lower inorganic layer may mean that the inorganic layer is relatively close to the substrate 100 in the vertical direction of the substrate 100.

Accordingly, since the upper inorganic layer covers up to the lower inorganic layer, the organic light emitting display device according to an exemplary embodiment of the present invention may suppress the lifting phenomenon between the adjacent layers at the edge of the encapsulation layer 300 and may reduce (or block) penetration of oxygen or moisture.

Meanwhile, the areas of the plurality of organic layers 320 may be increased moving in a direction away from the display unit 200. Since the areas of the plurality of inorganic layers 310 are increased moving in a direction away from the display unit 200, the areas of the plurality of organic layers 320 included in the region where the plurality of inorganic layers 310 is disposed are increased in proportion to the degree that the areas of the plurality of inorganic layers 310 are increased.

Thin film materials which may be used as the inorganic layers 310 and the organic layers 320, and a laminating method of the inorganic layers 310 and the organic layers 320, are without specific limitation and may be any material or method known in the art.

For example, the thin film material which is used as the inorganic layers 310 may contain at least one selected from a group constituted by silicon nitride, aluminum nitride, zirconium nitride, titanium nitride, hafnium nitride, tantalum nitride, silicon oxide, aluminum oxide, and titanium oxide.

The thin film material which is used as the organic layers 320 may contain at least one selected from a group constituted by epoxy, acrylate, urethane acrylate, polyurea, polyacrylate, PTCDA, BPDA, and PMDA.

However, any inorganic thin film materials or organic thin film materials which are known in the art may be used as the materials of the inorganic layers 310 or the organic layers 320 of the present invention.

The inorganic layers 310 and the organic layers 320 may be formed by using a spin coating process, a printing process, a sputtering process, a chemical vapor deposition (CVD) process, an atomic layer deposition (ALD) process, a plasma enhanced chemical vapor deposition (PECVD) process, a high density plasma-chemical vapor deposition (HDP-CVD) process, a vacuum deposition process, and the like according to a material for forming the encapsulation layer 300.

A thickness of each inorganic layer 310 configuring the plurality of inorganic layers 310 may be in the range of 10 nm to 50 nm.

When the thickness of each inorganic layer 310 is less than 10 nm, the penetration of moisture and oxygen may not be sufficiently blocked, and when the thickness of each inorganic layer 310 is more than 50 nm, the thickness of the organic light emitting display device may be increased and thus the organic light emitting display device may be an obstacle to thinness.

Meanwhile, as the inorganic layers 310 become thicker, the stress of the inorganic layers may be increased and thus the lifting phenomenon of the inorganic layers 310 may occur.

A thickness of each organic layer 320 configuring the plurality of organic layers 320 may be in the range of 10 nm to 50 nm. When the thickness of each organic layer 320 is less than 10 nm, it may be difficult to ensure flexibility of the organic light emitting display device, and when the thickness of each organic layer 320 is more than 50 nm, there may be a problem in that the thickness of the organic light emitting display device is increased. However, the numerical ranges of the inorganic layers 310 and the organic layers 320 may be changed according to a use and a function of a thin film encapsulation layer.

Figure 3:
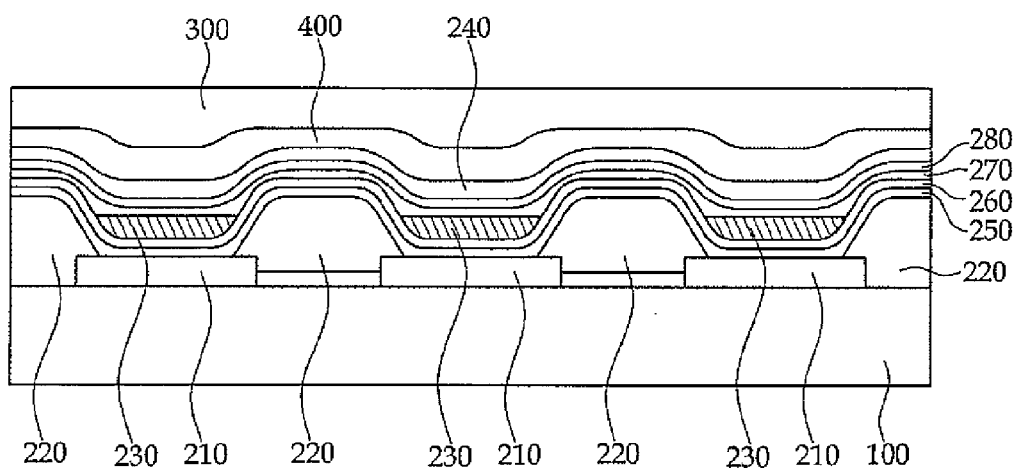
FIG. 3 is a diagram illustrating the organic light emitting display device illustrated in FIG. 1 in more detail.

FIG. 3 is a diagram illustrating the organic light emitting display device illustrated in FIG. 1 in more detail.

Referring to FIG. 3, the display unit 200 may include a first electrode 210 formed on the substrate 100, a pixel defining layer (PDL) 220 formed between the first electrodes 210, an emission layer 230 formed on the first electrode 210, and a second electrode 240 formed on the emission layer 230.

In the case where an organic light emitting display device is a front emission type, the first electrode 210 may contain at least one of gold (Au), platinum (Pt), nickel (Ni), tungsten (W), chromium (Cr), molybdenum (Mo), iron (Fe), cobalt (Co), copper (Cu), palladium (Pd), titanium (Ti), and a compound thereof. In addition, the second electrode 240 may contain at least one of indium tin oxide (ITO) and indium zinc oxide (IZO), which are transparent conductive oxides.

In the case where the organic light emitting display device is a rear emission type, the first electrode 210 may contain at least one of indium tin oxide (ITO) and indium zinc oxide (IZO), which are transparent conductive oxides having a high work function. In addition, the second electrode 240 may be made of metal having a low work function, that is, alkali metals such as lithium (Li) and cesium (Cs), alkaline earth metals such as magnesium (Mg), calcium (Ca) and strontium (Sr), and a compound thereof.

The first electrode 210 and the second electrode 240 may contain any materials which are known in the art.

The pixel defining layer 220 may be made of a material having an insulation property to partition the first electrodes 210 into pixel units. For example, the pixel defining layer 220 may be disposed at an edge of the first electrode 210 to partition the first electrodes into pixel unit and define pixel areas. The pixel defining layer 220 may cover the edge of the first electrode 210.

The emission layer 230 may include a red emission layer, a green emission layer, and a blue emission layer.

A hole injection layer (HIL) 250 and a hole transfer layer (HTL) 260 may be included between the first electrode 210 and the emission layer 230, and an electron transport layer (ETL) 270 and an electron injection layer (EIL) 280 may be included between the emission layer 230 and the second electrode 240.

A capping layer 400 may be disposed between the display unit 200 and the encapsulation layer 300, and the capping layer 400 may be made of a transparent material having ultraviolet light absorbing capacity.

Figure 4:
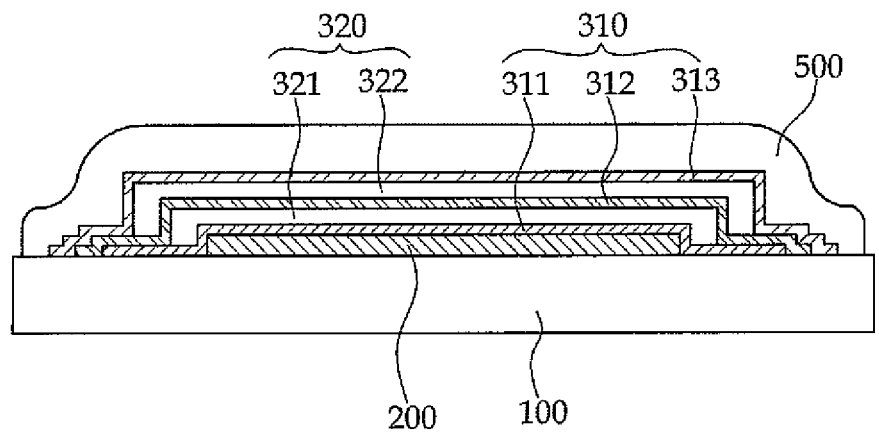
FIG. 4 is a cross-sectional view illustrating an organic light emitting display device according to another exemplary embodiment of the present invention.

FIG. 4 is a cross-sectional view illustrating an organic light emitting display device according to another exemplary embodiment of the present invention. Referring to FIG. 4, the organic light emitting display device according to another exemplary embodiment of the present invention may further include an encapsulation protecting layer 500 covering the encapsulation layer 300.

The encapsulation protecting layer 500 may seal the edge of the encapsulation layer 300 once more. Accordingly, the encapsulation protecting layer 500 may reduce (or prevent) the lifting phenomenon between the inorganic layers 310, increase an effect of reducing (or blocking) the penetration of oxygen or moisture, and better protect the organic light emitting display device from mechanical and physical damages applied from the outside.

The encapsulation protecting layer 500 may be made of an organic material, and the organic material may be the same as the material of the plurality of organic layers 320.

A thickness of the encapsulation protecting layer 500 may be approximately 1 to 20 µm. When the thickness of the encapsulation protecting layer 500 is less than 1 µm, the organic light emitting display device may be damaged due to external factors, and when the thickness of the encapsulation protecting layer 500 is more than 20 µm, there may be a problem in that the thickness of the organic light emitting display device is increased.

Figure 5A:
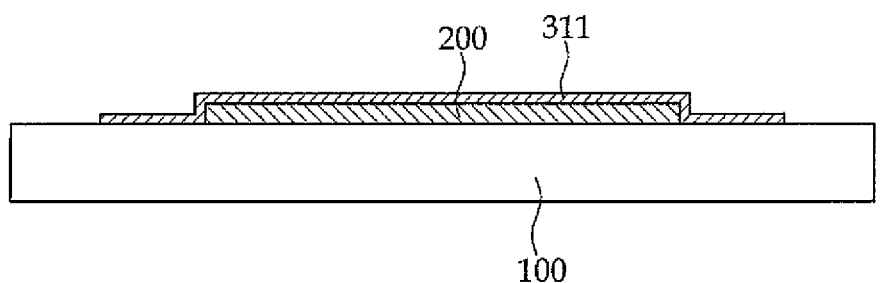
FIGS. 5A to 5C are diagrams schematically illustrating a manufacturing process of an organic light emitting display device according to an exemplary embodiment of the present invention.
Figure 5B:
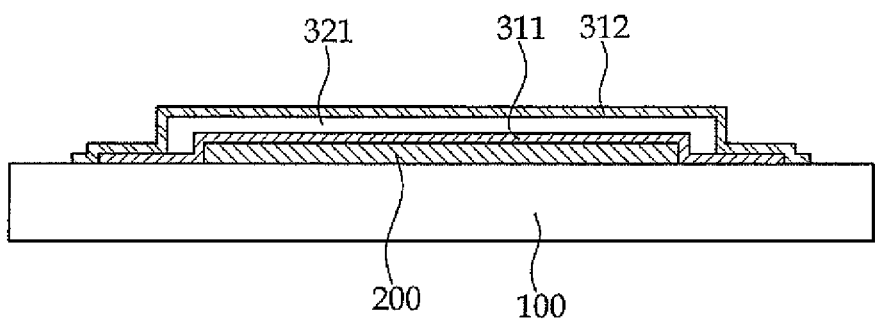
Figure 5C:
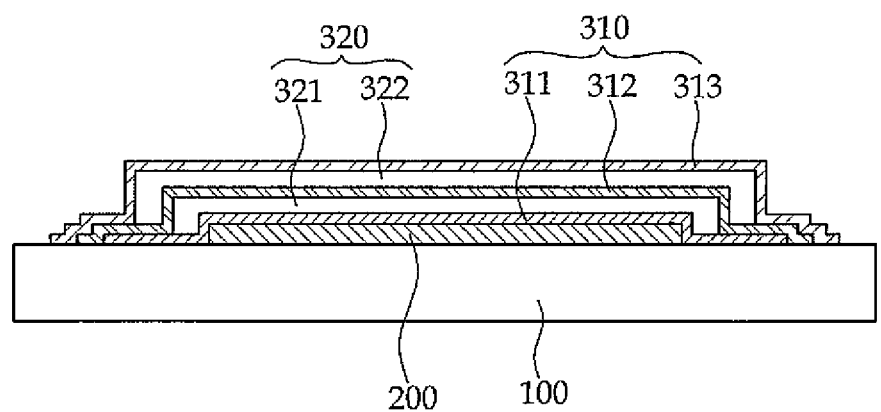

FIGS. 5A to 5C are diagrams schematically illustrating a manufacturing process of the organic light emitting display device according to an exemplary embodiment of the present invention.

In step (a), the first inorganic layer 311 is formed on the substrate 100 having the display unit 200 (see FIG. 5A). In step (b), the encapsulation layer 300 is formed on the display unit 200.

Step (b) includes step (c) and step (d) (see FIG. 5B).

In step (c), the first inorganic layer 311 covers the entire display unit 200 and a part of the substrate 100.

After step (c), in step (d), the first organic layer 321 is formed on the first inorganic layer 311, and the second inorganic layer 312 covers the first organic layer 321 and the first inorganic layer 311 (see FIG. 5B).

After step (d), laminating the inorganic layers 310 and the organic layers 320 in sequence may be repeated one or more times.

For example, after forming the second inorganic layer 312, the second organic layer 322 is formed on the second inorganic layer 312, and the third inorganic layer 313 covers the second inorganic layer 312 and the second organic layer 322 (see FIG. 5C). That is, in each step of forming the plurality of inorganic layers 310, the areas of the plurality of inorganic layers 310 may be largely formed to cover up to the ends of the already formed inorganic layers 310. The laminating of the plurality of organic layers 320 and the plurality of inorganic layers 310 in sequence may be performed 2 to 30 times.

Hereinafter, an organic light emitting display device according to a third exemplary embodiment of the present invention will be described with reference to FIG. 6. Configurations identical to those described in the above exemplary embodiment will not be further described for ease of description.

Figure 6:
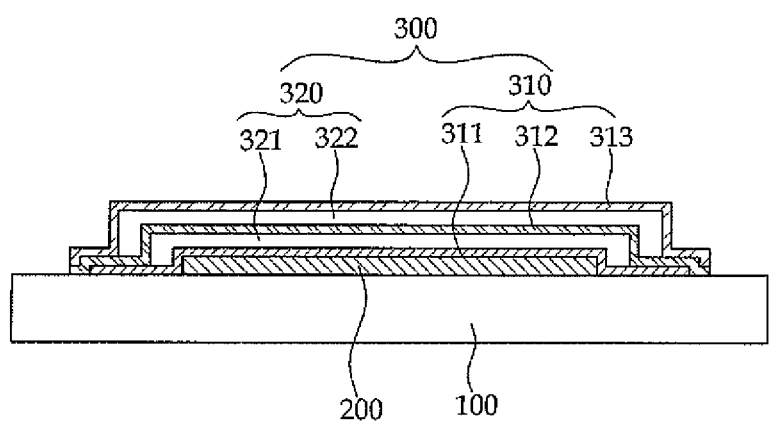
FIG. 6 is a schematic cross-sectional view illustrating the organic light emitting display device according to the third exemplary embodiment.

FIG. 6 is a schematic cross-sectional view illustrating the organic light emitting display device according to the third exemplary embodiment.

Referring to FIG. 6, an encapsulation layer 300 according to the third exemplary embodiment may be disposed on a display area 200 and may include a plurality of inorganic layers 310 and a plurality of organic layers 320. The plurality of inorganic layers 310 and the plurality of organic layers 320 are alternately laminated. The inorganic layer 310 may include at least first, second, and third inorganic layers 311, 312, and 313. The organic layer 320 may include at least first and second organic layers 321 and 322.

In some embodiments, as illustrated in FIG. 6, the first inorganic layer 311 may be disposed on the display area 200. The first organic layer 321 may be disposed on the first inorganic layer 311. The second inorganic layer 312 may be disposed on the first organic layer 321 and may cover end portions of the first inorganic layer 311. The second organic layer 321 may be disposed on the second inorganic layer 312. The third inorganic layer 313 may be disposed on the second organic layer 322 and the second inorganic layer 312.

Further, the second inorganic layer 312 may cover the end portions of the first organic layer 321. The third inorganic layer 3.13 may not cover end portions of the second inorganic layer 312 and may cover end portions of the second organic layer 322. In other words, only the second inorganic layer 312 may cover the end portions of the first inorganic layer 311 and the third inorganic layer 313 may be disposed only on the second inorganic layer 312. As the second inorganic layer 312 covers the end portions of the first inorganic layer 311, infiltration of oxygen or moisture through edge portions of the inorganic layer 310 may be prevented or efficiently reduced.

The inorganic layer 310 may be formed as a single film or laminated film including a metal oxide or metal nitride. In more detail, the inorganic layer 310 may include at least one of the followings: SiNx, Al2O3, SiO2, TiO2, SiON, ITO, AZO, ZnO, and ZrO.

The inorganic layer 310 may be formed by a vacuum film formation method, such as sputtering, chemical vapor deposition (CVD), e-beam, thermal evaporation, or thermal ion beam assisted deposition (IBAD). Examples of the CVD may include ICP-CVD (Induced Coupled Plasma-Chemical Vapor Deposition), CCP (Capacitively Coupled Plasma)-CVD, SWP (Surface Wave Plasma)-CVD and so on, which is, however, provided only for illustration, and all possible methods that are currently developed and commercially available or can be realized in the future according to the technological development may be employed in forming the inorganic material layer according to the present invention, which is, however, provided only for illustration, and all possible methods that are currently developed and commercially available or can be realized in the future according to the technological development may be employed in forming the inorganic material layer according to the present invention.

The organic layer 320 may be formed as a single layer or stacked layer including at least one of the following polymers: polyethylene terephthalate, polyimide, polycarbonate, epoxy, polyethylene, and polyacrylate. More desirably, the organic layer may be formed of polyacrylates and may include, in more detail, high-molecularized monomer components including diacrylate-based monomers or triacrylate-based monomers. The monomer components may further include monoacrylate-based monomers.

The organic layer 320 may be laminated by spin coating, spray coating, screen printing, ink-jetting, dispensing, and the like, but not limited thereto. In addition, all possible methods that are currently developed and commercially available or can be realized in the future according to the technological development may be employed in forming the organic material layer according to the present invention, and examples thereof may include sputtering, chemical vapor deposition (CVD), plasma enhanced chemical vapor deposition (PECVD), thermal evaporation, thermal ion beam assisted deposition (IBAD), and atomic layer deposition (ALD).

A lamination structure of the organic layer 320 and the inorganic layer 310 is not limited thereto. In some embodiments, a plurality of organic layers 320 and a plurality of inorganic layers 310 may be alternately laminated on the third inorganic layer 313 additionally. In this case, the plurality of inorganic layer 310 disposed on the third inorganic layer 313 may not cover the end portions of the lower inorganic layer.

Hereinafter, an organic light emitting display device according to a fourth exemplary embodiment of the present invention will be described with reference to FIG. 7. The fourth exemplary embodiment is a modified structure of the third exemplary embodiment according to an embodiment of the present invention, and thus repeated description will be omitted for brevity.

Figure 7:
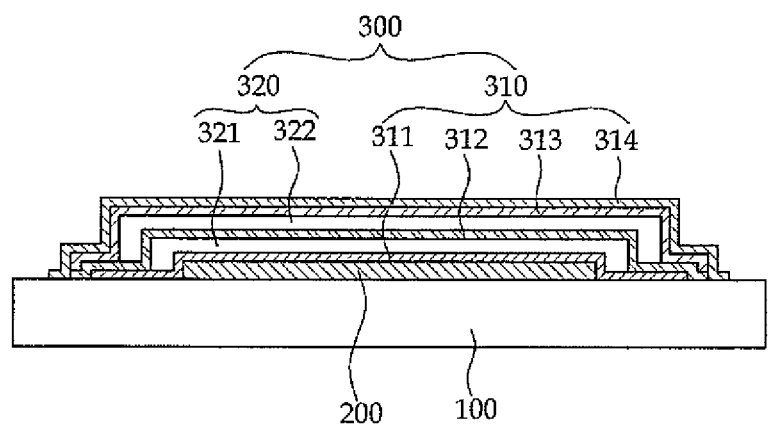
FIG. 7 is a schematic cross-sectional view illustrating the organic light emitting display device according to the forth exemplary embodiment.

FIG. 7 is a schematic cross-sectional view illustrating the organic light emitting display device according to the forth exemplary embodiment.

Referring to FIG. 7, an encapsulation layer 300 according to the fourth exemplary embodiment may further include a fourth inorganic layer 314. In more detail, an inorganic layer 310 further includes the fourth inorganic layer 314. The fourth inorganic layer 314 may be disposed on a third inorganic layer 313 and may cover end portions of the second and third inorganic layers 312 and 313. In some embodiments, the fourth inorganic layer 314 may be a top layer of the encapsulation layer 300 exposed outwards.

Meanwhile, the plurality of organic layers 320 and the plurality of inorganic layers 310 may be alternately laminated between the third and fourth inorganic layers 313 and 314.

According to the fourth exemplary embodiment, the fourth inorganic layer 314 may cover the end portions of the second and third inorganic layers 312 and 313, thereby preventing or efficiently reducing infiltration of oxygen and moisture through edge portions of the inorganic layer 310.

From the foregoing, it will be appreciated that various embodiments of the present invention have been described herein for purposes of illustration, and that various modifications may be made without departing from the scope and spirit of the present invention. Accordingly, the various embodiments disclosed herein are not intended to be limiting, with the true scope and spirit being indicated by the following claims and their equivalents.

What is claimed is:

1. An organic light emitting display device comprising:
 a substrate;
 a display area on the substrate; and
 an encapsulation layer disposed on the display area and comprising a plurality of inorganic layers and a plurality of organic layers,
 wherein the plurality of inorganic layers and the plurality of organic layers are alternately laminated,
 the plurality of inorganic layers comprises at least first to third inorganic layers,
 the plurality of organic layers comprises at least first and second organic layers,
 the first inorganic layer is disposed on the display area,
 the first organic layer is disposed on the first inorganic layer,
 the second inorganic layer is disposed on the first organic layer and covers end portions of the first inorganic layer,
 the second organic layer is disposed on the second inorganic layer,
 the third inorganic layer is disposed on the second organic layer and the second inorganic layer, and
 the third inorganic layer does not cover end portions of the second inorganic layer.

2. The organic light emitting display device of claim 1, wherein the plurality of inorganic layers further comprises an upper inorganic layer and lower inorganic layer, and the upper inorganic layer does not cover end portions of the lower inorganic layer.

3. The organic light emitting display device of claim 1, wherein the second inorganic layer covers end portions of the first organic layer.

4. The organic light emitting display device of claim 3, wherein the third inorganic layer covers end portions of the second organic layer.

5. The organic light emitting display device of claim 1,
 wherein the plurality of inorganic layers further comprises a fourth inorganic layer, and
 the fourth inorganic layer is disposed on the third inorganic layer and covers the end portions of the second inorganic layer and end portions of the third inorganic layer.

6. The organic light emitting display device of claim 5, wherein the second inorganic layer covers end portions of the first organic layer.

7. The organic light emitting display device of claim 6, wherein the third inorganic layer covers end portions of the second organic layer.

* * * * *